(12) United States Patent
Goorden et al.

(10) Patent No.: US 11,474,435 B2
(45) Date of Patent: Oct. 18, 2022

(54) METROLOGY SENSOR, ILLUMINATION SYSTEM AND METHOD OF GENERATING MEASUREMENT ILLUMINATION WITH A CONFIGURABLE ILLUMINATION SPOT DIAMETER

(71) Applicant: ASML Netherlands B. V., Veldhoven (NL)

(72) Inventors: Sebastianus Adrianus Goorden, Eindhoven (NL); Simon Reinald Huisman, Eindhoven (NL); Sergei Sokolov, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/415,671

(22) PCT Filed: Nov. 19, 2019

(86) PCT No.: PCT/EP2019/081723
§ 371 (c)(1),
(2) Date: Jun. 17, 2021

(87) PCT Pub. No.: WO2020/126257
PCT Pub. Date: Jun. 25, 2020

(65) Prior Publication Data
US 2022/0057718 A1    Feb. 24, 2022

(30) Foreign Application Priority Data
Dec. 20, 2018    (EP) .................................... 18214547

(51) Int. Cl.
*G03F 7/20* (2006.01)
*G02B 6/42* (2006.01)
*G02B 21/06* (2006.01)

(52) U.S. Cl.
CPC ....... *G03F 7/70191* (2013.01); *G02B 6/4298* (2013.01); *G02B 21/06* (2013.01); *G03F 7/70591* (2013.01)

(58) Field of Classification Search
CPC ............. G03F 7/70191; G03F 7/70591; G02B 6/4298; G02B 21/06
(Continued)

(56) References Cited

U.S. PATENT DOCUMENTS 6,967,710 B2 *  11/2005  Shiraishi ............. G03F 7/70075
                                                      355/53
9,594,240 B2 *   3/2017  Kimura .............. G02B 21/0016
(Continued)

FOREIGN PATENT DOCUMENTS

WO    WO 2009/078708 A1    6/2009
WO    WO 2009/106279 A1    9/2009
(Continued)

OTHER PUBLICATIONS

International Search Report and Written Opinion of the International Searching Authority directed to related International Patent Application No. PCT/EP2019/081723, dated Feb. 26, 2020; 11 pages.
(Continued)

*Primary Examiner* — Hung V Nguyen
(74) *Attorney, Agent, or Firm* — Sterne, Kessler, Goldstein & Fox P.L.L.C.

(57) ABSTRACT

Disclosed is an illumination system for delivering incoherent radiation to a metrology sensor system. Also disclosed is an associated metrology system and method. The illumination system comprises a spatial filter system for selective spatial filtering of a beam of said incoherent radiation outside of a module housing of the metrology sensor system. At least one optical guide is provided for guiding the
(Continued)

spatially filtered beam of incoherent radiation to the metrology sensor system, the at least one optical guide being such that the radiation guided has a substantially similar output angle as input angle.

18 Claims, 5 Drawing Sheets

(58) Field of Classification Search
USPC .................................................. 355/67–71
See application file for complete search history.

(56) References Cited

U.S. PATENT DOCUMENTS

| | | | |
|---|---|---|---|
| 10,599,047 B2* | 3/2020 | Ravensbergen | G01B 11/272 |
| 2003/0212525 A1 | 11/2003 | Bischoff et al. | |
| 2005/0073684 A1 | 4/2005 | Norton | |
| 2006/0033921 A1 | 2/2006 | Den Boef et al. | |
| 2006/0066855 A1 | 3/2006 | Boef et al. | |
| 2010/0201963 A1 | 8/2010 | Cramer et al. | |
| 2010/0279446 A1* | 11/2010 | Henrichs | B82Y 20/00 |
| | | | 977/774 |
| 2011/0027704 A1 | 2/2011 | Cramer et al. | |
| 2011/0043791 A1 | 2/2011 | Smilde et al. | |
| 2011/0102753 A1 | 5/2011 | Van De Kerkhof et al. | |
| 2012/0044470 A1 | 2/2012 | Smilde et al. | |
| 2012/0123581 A1 | 5/2012 | Smilde et al. | |
| 2013/0114085 A1 | 5/2013 | Wang et al. | |
| 2013/0258310 A1 | 10/2013 | Smilde et al. | |
| 2013/0271740 A1 | 10/2013 | Quintanilha | |
| 2014/0146322 A1 | 5/2014 | Hill et al. | |
| 2015/0160445 A1 | 6/2015 | Kimura et al. | |

FOREIGN PATENT DOCUMENTS

| | | |
|---|---|---|
| WO | WO 2013/114259 A1 | 8/2013 |
| WO | WO 2013/178422 A1 | 12/2013 |
| WO | WO 2017/144265 A1 | 8/2017 |
| WO | WO 2018/114152 A1 | 6/2018 |

OTHER PUBLICATIONS

International Preliminary Report on Patentability directed to related International Patent Application No. PCT/EP2019/081723, dated Jun. 16, 2021; 8 pages.
Research Disclosure No. 605009, Sep. 2014; 6 pages.

* cited by examiner

METROLOGY SENSOR, ILLUMINATION SYSTEM AND METHOD OF GENERATING MEASUREMENT ILLUMINATION WITH A CONFIGURABLE ILLUMINATION SPOT DIAMETER

CROSS-REFERENCE TO RELATED APPLICATION

This application claims priority of EP application 18214547.4 which was filed on Dec. 20, 2018 and which is incorporated herein in its entirety by reference.

BACKGROUND

Field of the Invention

The present invention relates to methods and apparatus usable, for example, in the manufacture of devices by lithographic techniques, and to methods of manufacturing devices using lithographic techniques. The invention relates more particularly to metrology sensors.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor, typically an optical position sensor. The lithographic apparatus includes one or more alignment sensors by which positions of marks on a substrate can be measured accurately. Different types of marks and different types of alignment sensors are known from different manufacturers and different products of the same manufacturer.

In other applications, metrology sensors are used for measuring exposed structures on a substrate (either in resist and/or after etch). A fast and non-invasive form of specialized inspection tool is a scatterometer in which a beam of radiation is directed onto a target on the surface of the substrate and properties of the scattered or reflected beam are measured. Examples of known scatterometers include angle-resolved scatterometers of the type described in US2006033921A1 and US2010201963A1. In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

In some metrology applications, such as in some scatterometers or alignment sensors, it is often desirable to be able to measure on increasingly smaller targets, while also maintaining compatibility with present, or larger target sizes. During a measurement it is preferred to match measurement spot size to the target, for example, so that neighboring structures do not interfere with or effect the measurement. Improved methods for achieving this will be described.

SUMMARY OF THE INVENTION

The invention in a first aspect provides an illumination system for delivering incoherent radiation to a metrology sensor system, said illumination system comprising: a spatial filter system for selective spatial filtering of a beam of said incoherent radiation; and at least one optical guide for guiding the spatially filtered beam of incoherent radiation to the metrology sensor system, the at least one optical guide being such that the radiation guided has a substantially similar output angle as input angle.

The invention in a second aspect provides a metrology sensor system comprising: a module housing, containing metrology sensor system optics; and the illumination system of the first aspect for spatially filtering and delivering incoherent input radiation to the module housing; wherein at least said spatial filter system of the illumination system is comprised outside of the module housing; and the metrology sensor system is operable to generate measurement illumination from the incoherent input radiation, the illumination spot diameter of the measurement illumination being dependent upon said selective spatial filtering by the spatial filter system.

The invention in a third aspect provides a metrology sensor system comprising: a module housing, containing metrology sensor system optics including an objective lens; and the illumination system of the first aspect for spatially filtering and delivering incoherent input radiation to the module housing; wherein at least said spatial filter system of the illumination system is comprised outside of the module housing; and the metrology sensor system is operable to generate measurement illumination from the incoherent input radiation, the illumination numerical aperture of the objective lens being dependent upon said selective spatial filtering by the spatial filter system.

The invention also provides for a lithographic apparatus comprising a metrology sensor system according to the second or third aspect of the invention.

The invention also provides for a method of generating measurement illumination with a configurable illumination spot diameter, the method comprising: generating a beam of incoherent input radiation; selectively spatially filtering said beam of incoherent radiation; guiding the spatially filtered beam of incoherent radiation to within a module housing of a metrology sensor system using an optical guide being configured such that the radiation guided has a substantially similar output angle as input angle; and generating measurement illumination from the spatially filtered beam of incoherent radiation, the illumination spot diameter of the measurement illumination being dependent upon said selective spatial filtering performed outside of said module housing.

The above and other aspects of the invention will be understood from a consideration of the examples described below.

BRIEF DESCRIPTION OF THE DRAWINGS

Embodiments of the invention will now be described, by way of example only, with reference to the accompanying drawings, in which.

DETAILED DESCRIPTION OF EMBODIMENTS

Before describing embodiments of the invention in detail, it is instructive to present an example environment in which embodiments of the present invention may be implemented.

Figure 1:
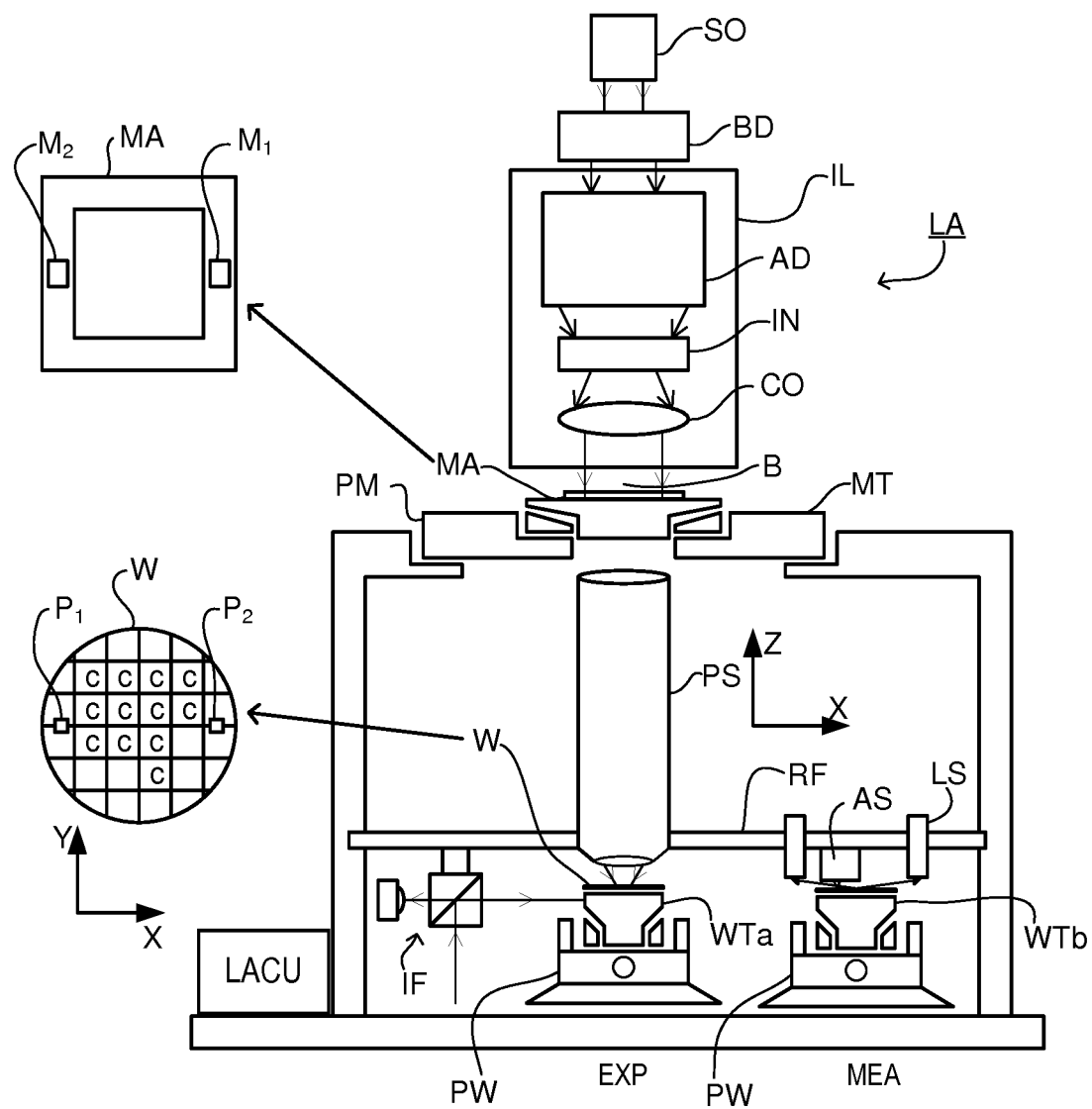
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
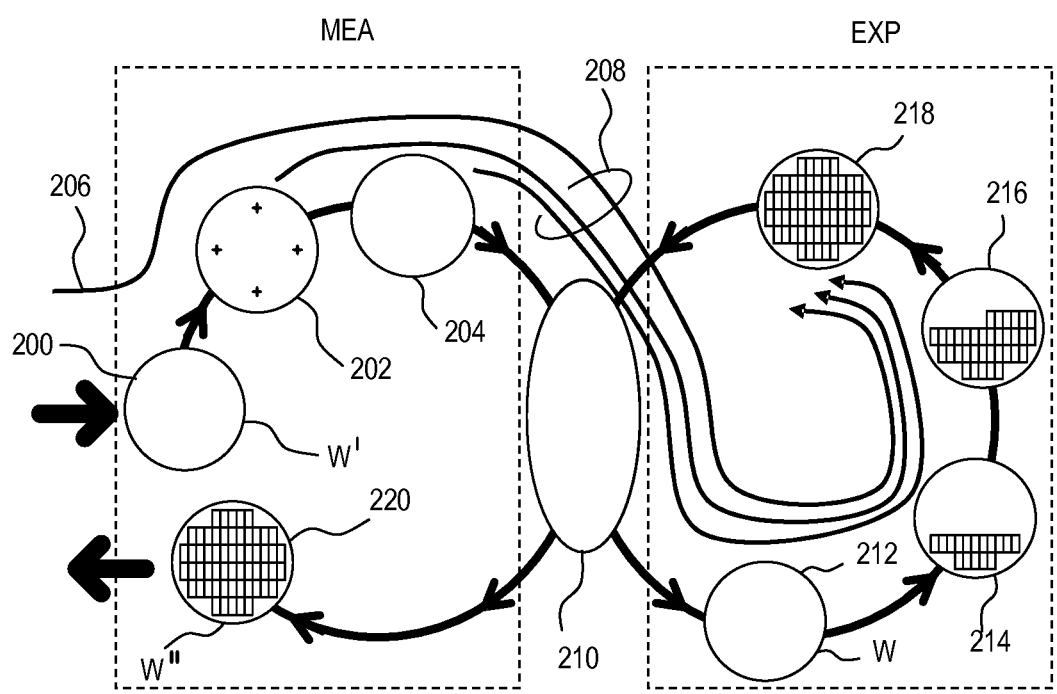
FIG. 2 illustrates schematically measurement and exposure processes in the apparatus of FIG. 1.

FIG. 2 illustrates the steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. Advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

The skilled person will know that the above description is a simplified overview of a number of very detailed steps involved in one example of a real manufacturing situation. For example rather than measuring alignment in a single pass, often there will be separate phases of coarse and fine measurement, using the same or different marks. The coarse and/or fine alignment measurement steps can be performed before or after the height measurement, or interleaved.

A specific type of metrology sensor, which as both alignment and product/process monitoring metrology applications has recently been recently disclosed. This describes a metrology device with optimized coherence. More specifically, the metrology device is configured to produce a plurality of spatially incoherent beams of measurement illumination, each of said beams (or both beams of measurement pairs of said beams, each measurement pair corresponding to a measurement direction) having corresponding regions within their cross-section for which the phase relationship between the beams at these regions is known; i.e., there is mutual spatial coherence for the corresponding regions.

Such a metrology device is able to measure small pitch targets with acceptable (minimal) interference artifacts (speckle) and will also be operable in a dark-field mode. Such a metrology device may be used as a position or alignment sensor for measuring substrate position (e.g., measuring the position of a periodic structure or alignment mark with respect to a fixed reference position). However, the metrology device is also usable for measurement of overlay (e.g., measurement of relative position of periodic structures in different layers, or even the same layer in the case of stitching marks). The metrology device is also able to measure asymmetry in periodic structures, and therefore could be used to measure any parameter which is based on a target asymmetry measurement (e.g., overlay using diffraction based overlay (DBO) techniques or focus using diffraction based focus (DBF) techniques).

Figure 3:
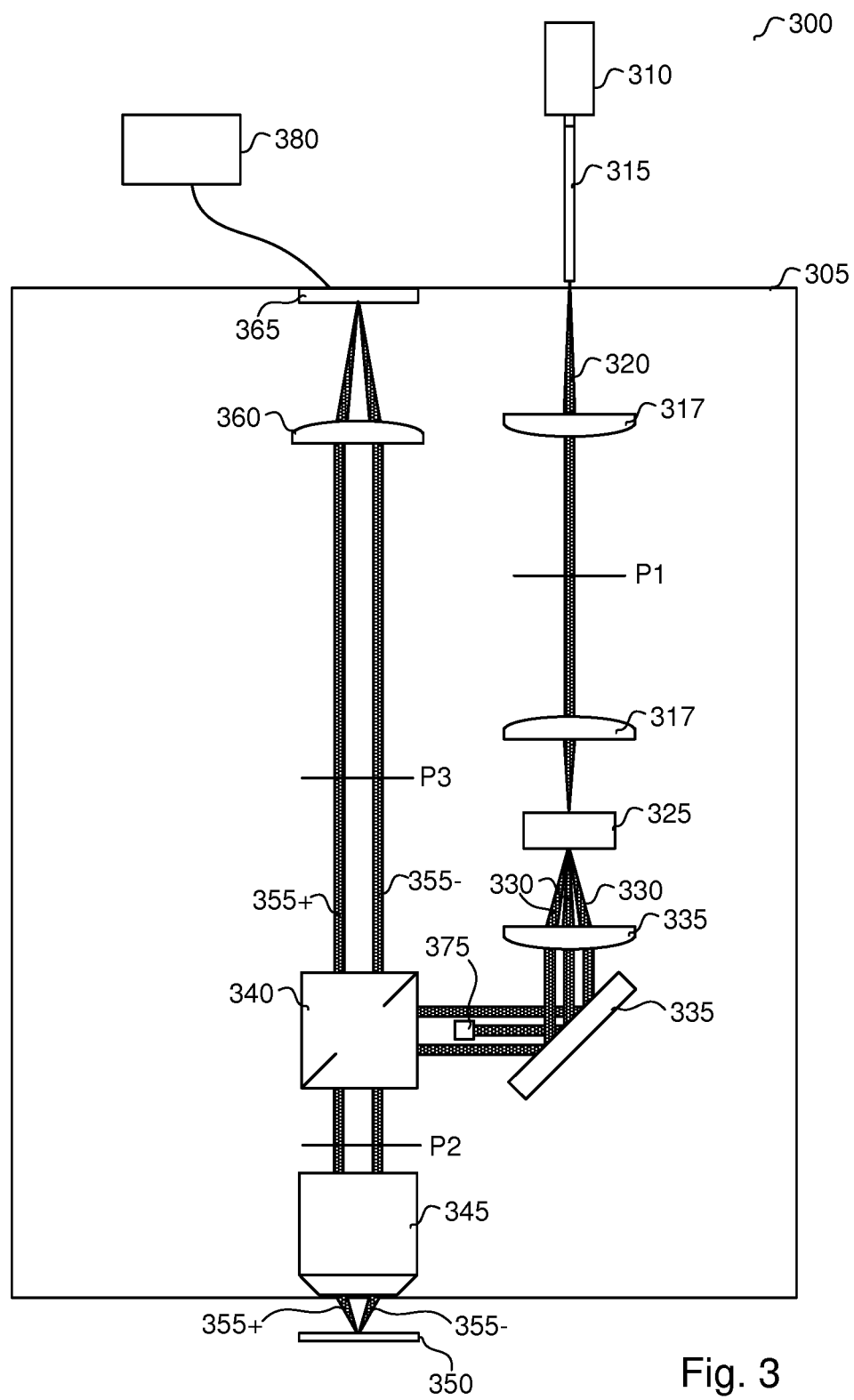
FIG. 3 is a schematic illustration of an example metrology device adaptable according to an embodiment of the invention.

FIG. 3 shows a possible implementation of such a metrology device. The metrology device essentially operates as a standard microscope with a novel illumination mode. The metrology device 300 comprises an optical module 305 comprising the main components of the device. An illumination source 310 (which may be located outside the module 305 and optically coupled thereto by a multimode fiber 315) provides a spatially incoherent radiation beam 320 to the optical module 305. Optical components 317 deliver the spatially incoherent radiation beam 320 to a coherent off-axis illumination generator 325. This component is of particular importance to the concepts herein and will be described in greater detail. The coherent off-axis illumination generator 325 generates a plurality (e.g., four) off-axis beams 330 from the spatially incoherent radiation beam 320. The characteristics of these off-axis beams 330 will be described in detail further below. The zeroth order of the illumination generator may be blocked by an illumination zero order block element 375. This zeroth order will only be present for some of the coherent off-axis illumination generator examples described in this document (e.g., phase grating based illumination generators), and therefore may be omitted when such zeroth order illumination is not generated. The off-axis beams 330 are delivered (via optical components 335 and) a spot mirror 340 to an (e.g., high NA) objective lens 345. The objective lens focusses the off-axis beams 330 onto a sample (e.g., periodic structure/alignment mark) located on a substrate 350, where they scatter and diffract. The scattered higher diffraction orders 355+, 355− (e.g., +1 and −1 orders respectively), propagate back via the spot mirror 340, and are focused by optical component 360 onto a sensor or camera 365 where they interfere to form an interference pattern. A processor 380 running suitable software can then process the image(s) of the interference pattern captured by camera 365.

The zeroth order diffracted (specularly reflected) radiation is blocked at a suitable location in the detection branch; e.g., by the spot mirror 340 and/or a separate detection zero-order block element. It should be noted that there is a zeroth order reflection for each of the off-axis illumination beams, i.e. in the current embodiment there are four of these zeroth order reflections in total. An example aperture profile suitable for blocking the four zeroth order reflections is shown in FIGS.

4(b) and (c), labelled 422. As such, the metrology device operated as a "dark field" metrology device.

A main concept of the proposed metrology device is to induce spatial coherence in the measurement illumination only where required. More specifically, spatial coherence is induced between corresponding sets of pupil points in each of the off-axis beams 330. More specifically, a set of pupil points comprises a corresponding single pupil point in each of the off-axis beams, the set of pupil points being mutually spatially coherent, but where each pupil point is incoherent with respect to all other pupil points in the same beam. By optimizing the coherence of the measurement illumination in this manner, it becomes feasible to perform dark-field off-axis illumination on small pitch targets, but with minimal speckle artifacts as each off-axis beam 330 is spatially incoherent.

Figure 4:
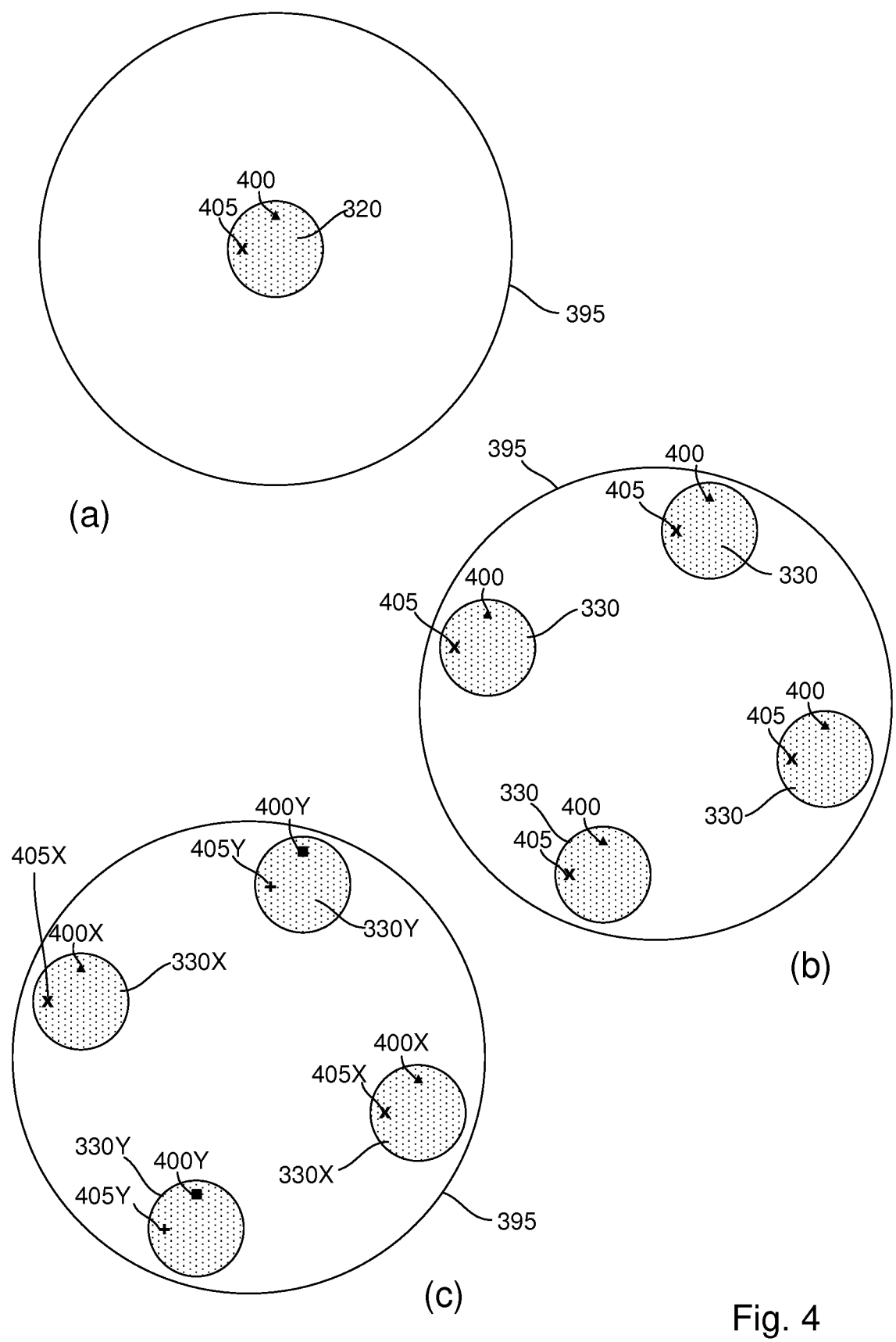
FIG. 4 comprises (a) a pupil image of input radiation (b) pupil image of off-axis illumination beams illustrating an operational principle of the metrology device of FIG. 3; and (c) pupil image of off-axis illumination beams illustrating another operational principle of the metrology device of FIG. 3.

FIG. 4 shows three pupil images to illustrate the concept. FIG. 4(a) shows a first pupil image which relates to pupil plane P1 in FIG. 2, and FIGS. 4(b) and 4(c) each show a second pupil image which relates to pupil plane P2 in FIG. 2. FIG. 4(a) shows (in cross-section) the spatially incoherent radiation beam 320, and FIGS. 4(b) and 4(c) show (in cross-section) the off-axis beams 330 generated by coherent off-axis illumination generator 325 in two different embodiments. In each case, the extent of the outer circle 395 corresponds to the maximum detection NA of the microscope objective; this may be, purely by way of an example 0.95 NA.

The triangles 400 in each of the pupils indicate a set of pupil points that are spatially coherent with respect to each other. Similarly, the crosses 405 indicate another set of pupil points which are spatially coherent with respect to each other. The triangles are spatially incoherent with respect to crosses and all other pupil points corresponding to beam propagation. The general principle (in the example shown in FIG. 4(b)) is that each set of pupil points which are mutually spatially coherent (each coherent set of points) have identical spacings within the illumination pupil P2 as all other coherent sets of points. As such, in this embodiment, each coherent sets of points is a translation within the pupil of all other coherent sets of points.

In FIG. 4(b), the spacing between each pupil point of the first coherent set of points represented by triangles 400 must be equal to the spacing between each pupil point of the coherent set of points represented by crosses 405. 'Spacing' in this context is directional, i.e., the set of crosses (second set of points) is not allowed to be rotated with respect to the set of triangles (first set of points). As such, each of the off-axis beams 330 comprises by itself incoherent radiation; however the off-axis beams 330 together comprise identical beams having corresponding sets of points within their cross-section that have a known phase relationship (spatial coherence). It should be noted that it is not necessary for the points of each set of points to be equally spaced (e.g., the spacing between the four triangles 405 in this example is not required to be equal). As such, the off-axis beams 330 do not have to be arranged symmetrically within the pupil.

FIG. 4(c) shows that this basic concept can be extended to providing for a mutual spatial coherence between only the beams corresponding to a single measurement direction where beams 330X correspond to a first direction (X-direction) and beams 330Y correspond to a second direction (Y-direction). In this example, the squares and plus signs each indicate a set of pupil points which correspond to, but are not necessarily spatially coherent with, the sets of pupil points represented by the triangles and crosses. However, the crosses are mutually spatially coherent, as are the plus signs, and the crosses are a geometric translation in the pupil of the plus signs. As such, in FIG. 4(c), the off-axis beams are only pair-wise coherent.

In this embodiment, the off-axis beams are considered separately by direction, e.g., X direction 330X and Y direction 330Y. The pair of beams 330X which generate the captured X direction diffraction orders need only be coherent with one another (such that pair of points 400X are mutually coherent, as are pair of points 405X). Similarly the pair of beams 330Y which generate the captured Y direction diffraction orders need only be coherent with one another (such that pair of points 400Y are mutually coherent, as are pair of points 405Y). However, there does not need to be coherence between the pairs of points 400X and 400Y, nor between the pairs of points 405X and 405Y. As such there are pairs of coherent points comprised in the pairs of off-axis beams corresponding to each considered measurement direction. As before, for each pair of beams corresponding to a measurement direction, each pair of coherent points is a geometric translation within the pupil of all the other coherent pairs of points.

In many metrology devices, it is often desirable to have a configurable spot size (i.e., diameter of the measurement illumination spot on the substrate). In particular, this provides flexibility in measuring different target sizes. When measuring a target, it is often preferable to "underfill" the target with radiation, i.e., the illumination spot is smaller than the target, and (at least approximately) centered on it. In this way, any influence on the measurement by adjacent structures can be minimized. The metrology device described above, for example, is designed to be compatible with many different target sizes and types. Similarly, the metrology devices described in, for example, WO 2009/078708 and WO 2009/106279 (and the other documents mentioned in the introduction) are also designed to measure on different target sizes.

A typical method for varying the illumination spot size would be to include a tunable element, such as a spatial filter, within the optical module of the metrology system (e.g., at a suitable location within optical module housing 305 of the device illustrated in FIG. 3). This, however, is undesirable for a number of reasons. In particular, there may be volume, thermal, vibrational and/or other constraints, within the optical module which prevent this, or at least make it undesirable. In particular, it is undesirable to place a movable/tunable filter inside the optical module due to the corresponding vibrational and thermal impact of such a movable/tunable filter.

As such, it is proposed that a tunable element, such as a spot size selector or spatial filter, is implemented outside of the optical module housing of a suitable metrology device. In particular, a suitable metrology device is any metrology device where:

the illumination provided to the optical module is spatially incoherent, the illumination spot on the substrate is rotationally symmetric, and the light is transported to the optical module using a multimode fiber or other optical guide for which the output angle (with respect to normal) of the output illumination equals, or is at least substantially equal to, the input angle (with respect to normal) of the input illumination for all input angles. In reality, such fibers (particularly when bent) may slightly alter the angle with respect to normal, but not scramble it completely. This slightly altered angle is a "substantially similar" angle within the context of the claims.

It should be appreciated that, for a light ray incident on a multimode fiber at coordinate (x,y,φ,θ), where x, y denote position, φ denotes azimuthal angle and θ denotes the angle with respect to the normal, then output angle $\theta_{out}$ at the output is equal to input angle $\theta_{in}$ at the input (whereas x, y and φ are scrambled). As a result the emerging output illumination from the multimode fiber will comprise an output cone having a maximum output half-cone angle $\theta_{out}$ equal to the maximum input half-cone angle $\theta_{in}$ of the input cone. Note that this is true for some other types of optical guides other than multimode fibers, and the concepts described herein are equally applicable to any such optical guides.

Figure 5:
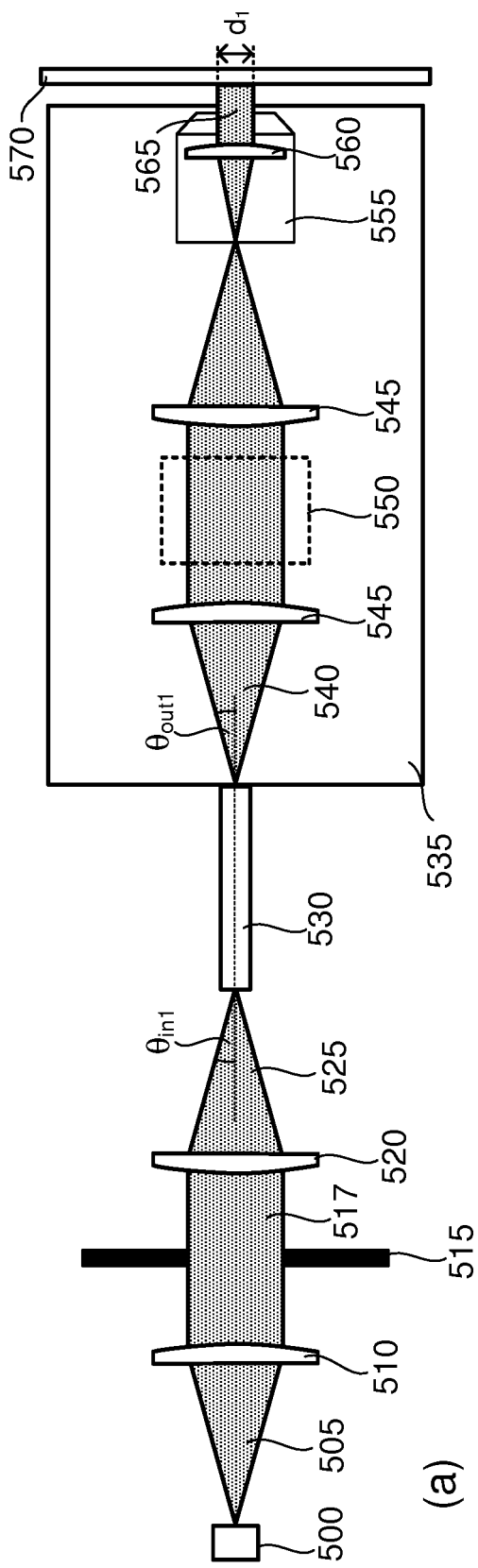
FIG. 5 illustrates schematically a spot size section arrangement in accordance with an embodiment of the invention, according to (a) a first spot size setting, and (b) a second spot size setting.
Figure 5:
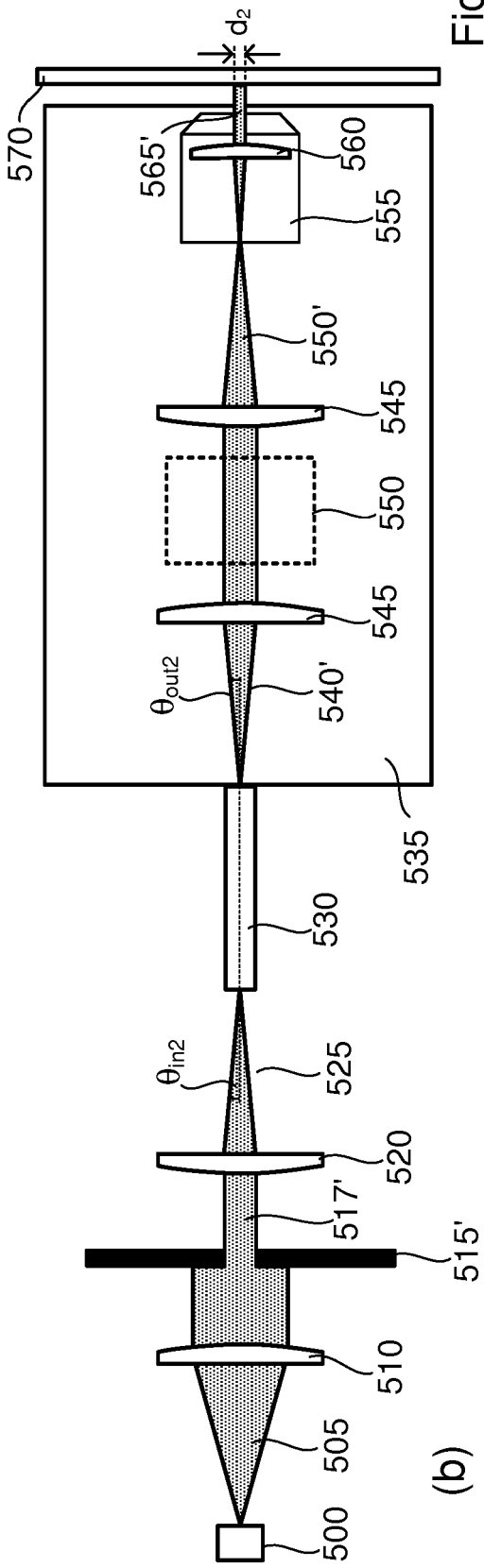

FIG. 5 is a simplified schematic drawing showing a detail of a proposed arrangement. FIGS. 5(a) and 5(b) each show the same apparatus, with different spot size settings. In FIG. 5(a), the spot size selector 515 is set for a relatively larger spot size (illumination spot diameter) $d_1$ on the substrate 570, while in FIG. 5(b), the spot size selector 515' is set for a relatively smaller spot size (illumination spot diameter) $d_2$ on the substrate 570.

The proposed spot size selector 515, 515' is implemented outside of the optical module 535 of a metrology device. The metrology device may be a position or alignment sensor for measuring position of an alignment mark and/or a metrology device for measuring other process parameters such as critical dimension, focus and overlay for example (e.g., using scatterometry techniques). In the context of the example metrology device 300, the proposed spot size selector 515 arrangement may be located between illumination source 310 and multimode fiber 315.

A substantially spatially incoherent radiation source 500 provides spatially incoherent radiation 505, which is made into a parallel beam by parallelizing optical element 510. The parallel beam passes through the spot size selector 515 (e.g., a spatial filter), set in this example to allow the full beam through (no blocked radiation); as such the spot size selector 515 is set for the maximum illumination spot diameter. Focusing optical element 520 focuses the filtered radiation 517, such that the focused radiation 525 is incident on a multimode fiber 530 or other suitable waveguide which preserves input angle (as described).

The multimode fiber 530 transports the (spatially filtered) radiation 540 to the optical model 535, where it is emitted in the form of a cone having the same output half-cone angle $\theta_{out1}$ as its input half-cone angle $\theta_{in1}$. The radiation is transmitted through the optical system 545 and the intervening metrology device optics 550 (which depend on the actual metrology device, the detail of which is unimportant to the concepts described herein). Objective lens system 555, comprising final lens 560, focusses the measurement illumination 565 onto the substrate 570 as a measurement spot having an illumination spot diameter $d_1$. It should be appreciated that, as the output half-cone angle $\theta_{out1}$ from the multimode fiber 530 is the same as the input half-cone angle $\theta_{in1}$, the illumination spot diameter $d_1$ is determined by the input half-cone angle $\theta_{in1}$ and therefore the diameter of the filtered radiation 517 determined by the spot size selector 515.

FIG. 5(b) show the same apparatus, but where the spot size selector 515' (e.g., spatial filter) is set for a smaller illumination spot diameter dz. As such, the spot size selector 515' spatially filters the spatially incoherent radiation 505. The filtered radiation 517 is focused into the multimode fiber 530 with an input half-cone angle $\theta_{in2}$, smaller than $\theta_{in1}$. As a result, the output half-cone angle $\theta_{out2}$ of radiation 540' is smaller than output half-cone angle $\theta_{out1}$ and therefore the illumination spot diameter $d_2$ is smaller than the illumination spot diameter $d_1$. Consequently, a spot size selector implemented outside of optical module 535. In particular, a spot size selector is implemented which has no associated moving parts inside of the optical module 535.

Note that the actual form of the spot size selector is not crucial and may differ from the spatial filter type arrangement illustrated. The spot size selector may comprise individual apertures of different sizes which can be swapped in and out of position (e.g., they may be separate filters, or part of an aperture disc which can be rotated so that a selected aperture filters the radiation). Alternatively, the filter may comprise a tunable filter having a tunable aperture size (e.g., an iris type aperture). As such, the spot size selector may enable selection between two or more discrete sizes, or may be continuously tunable in a size range.

It should be appreciated that a similar system to that described herein could be used for other aperture sizing applications. For example, such a system may be used to tune the illumination NA of a sensor or metrology device (e.g. the metrology device as illustrated in FIG. 3), rather than the spot size on the substrate. NA tuning would be useful in such a metrology device as tuning the illumination NA has a large impact on (effectively) the spatial coherence length on the substrate, which to a large extent determines the amount of cross-talk from surrounding structures. It is desirable to maximize illumination NA, so as to minimize cross-talk from surrounding structures. On the other hand, a large illumination NA makes it more likely to have zeroth order leakage around the zeroth order (pupil) stop. That may negatively impact alignment performance. Therefore, the optimal illumination NA may comprise a trade-off or compromise with respect to optimal alignment accuracy and reproducibility. This optimal NA may depend on stack properties, such as wafer quality (~diffraction efficiency). A tunable NA would allow to set the optimal illumination NA for each stack (or application).

Such a metrology device may implement tunable illumination NA by imaging the exit surface of multimode fiber 530 onto the substrate 570, instead of onto the back-focal plane of the objective lens 555. As such, it would require 1 more (or 1 less) lens inside the optical module 535 between fiber exit and substrate.

While specific embodiments of the invention have been described above, it will be appreciated that the invention may be practiced otherwise than as described.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention claimed is:

1. An illumination system comprising:
a spatial filter system configured to perform selective spatial filtering of a beam of incoherent radiation; and
at least one optical guide configured to guide the spatially filtered beam of the incoherent radiation to a metrology sensor system,
the at least one optical guide being such that the incoherent radiation guided has a substantially similar output angle as input angle,
wherein the metrology sensor system is operable to generate measurement illumination from the incoherent radiation, an illumination spot diameter of the measurement illumination being dependent upon the selective spatial filtering by the spatial filter system, and
wherein the spatial filter system comprises at least one aperture having a selectable size to implement the selective spatial filtering.

2. The illumination system of claim 1, wherein the at least one aperture is substantially circular having a selectable diameter.

3. The illumination system of claim 2, wherein the spatial filter system comprises a plurality of apertures having different sizes, the selective spatial filtering being implemented by a selection of one of the apertures to filter the beam of incoherent radiation.

4. The illumination system of claim 1, wherein the spatial filter system comprises a single aperture having a configurable size to implement the selective spatial filtering.

5. The illumination system of claim 1, further comprising:
a focusing optical element configured to focus the spatially filtered beam of the incoherent radiation onto an input of the at least one optical guide as an input cone having a first half-cone angle, such that a resulting output cone of the guided incoherent radiation has the first half-cone angle.

6. The illumination system of claim 1, comprising a parallelizing optical element to define a parallel beam of the incoherent radiation, such that the spatial filter system spatially filters the parallel beam of the incoherent radiation to implement the selective spatial filtering.

7. The illumination system of claim 1, comprising an illumination source for generating the incoherent radiation.

8. The illumination system of claim 1, wherein the at least one optical guide comprises a multimode fiber.

9. A metrology sensor system comprising:
a module housing containing metrology sensor system optics; and
an illumination system comprising:
a spatial filter system configured to perform selective spatial filtering of a beam of incoherent radiation; and
at least one optical guide configured to guide the spatially filtered beam of the incoherent radiation to the metrology sensor system,
the at least one optical guide being such that the incoherent radiation guided has a substantially similar output angle as input angle for spatially filtering and delivering the incoherent radiation to the module housing,
wherein at least the spatial filter system of the illumination system is positioned outside of the module housing, and
wherein the metrology sensor system is operable to generate measurement illumination from the incoherent radiation, an illumination spot diameter of the measurement illumination being dependent upon the selective spatial filtering by the spatial filter system.

10. A metrology sensor system comprising:
a module housing comprising metrology sensor system optics including an objective lens; and
an illumination system comprising:
a spatial filter system configured to perform selective spatial filtering of a beam of incoherent radiation; and
at least one optical guide configured to guide the spatially filtered beam of the incoherent radiation to the metrology sensor system,
the at least one optical guide being such that the incoherent radiation guided has a substantially similar output angle as input angle for spatially filtering and delivering the incoherent radiation to the module housing,
wherein at least the spatial filter system of the illumination system is located outside of the module housing, and
wherein the metrology sensor system is operable to generate measurement illumination from the incoherent radiation, an illumination numerical aperture of the objective lens being dependent upon the selective spatial filtering by the spatial filter system.

11. The metrology sensor system of claim 9, wherein the metrology sensor system is implemented as an alignment sensor system configured to measure alignment within a lithographic apparatus.

12. The metrology sensor system of claim 10, wherein the metrology sensor system is implemented as a process monitoring sensor system configured to measure one or more process parameters of structures formed using a lithographic apparatus.

13. A lithographic apparatus comprising:
a metrology sensor system comprising:
a module housing comprising metrology sensor system optics including an objective lens; and
an illumination system configured to deliver incoherent radiation to the metrology sensor system, the illumination system comprising:
a spatial filter system configured to perform selective spatial filtering of a beam of the incoherent radiation; and
at least one optical guide for guiding the spatially filtered beam of the incoherent radiation to the metrology sensor system,
the at least one optical guide being such that the radiation guided has a substantially similar output angle as input angle and is configured to perform the spatial filtering and to deliver the incoherent radiation to the module housing,
wherein at least the spatial filter system of the illumination system is positioned outside of the module housing, and
wherein the metrology sensor system is operable to generate measurement illumination from the incoherent radiation, an illumination numerical aperture of the objective lens being dependent upon the selective spatial filtering by the spatial filter system.

14. A method comprising:
generating a beam of incoherent radiation;
selectively spatially filtering the beam of incoherent radiation;
guiding the spatially filtered beam of the incoherent radiation to within a module housing of a metrology sensor system using an optical guide being configured such that the incoherent radiation guided has a substantially similar output angle as input angle; and
generating measurement illumination from the spatially filtered beam of the incoherent radiation, an illumination spot diameter of the measurement illumination being dependent upon the selective spatial filtering performed outside of the module housing,
wherein the spatial filtering is performed using at least one aperture having a selectable size.

15. The method of claim 14, further comprising selecting an aperture from a plurality of apertures of different sizes to select and/or change the illumination spot diameter.

16. The method claim 14, further comprising configuring a size of a single aperture having a configurable size to select and/or change the illumination spot diameter.

17. The method of claim 14, further comprising focusing the spatially filtered beam of the incoherent radiation onto an input of the at least one optical guide as an input cone having a first half-cone angle, such that a resulting output cone of the guided incoherent radiation has the first half-cone angle.

18. The method of claim 14, further comprising defining a parallel beam of the incoherent radiation, such that the spatial filtering is of the parallel beam of incoherent radiation.

* * * * *

UNITED STATES PATENT AND TRADEMARK OFFICE
CERTIFICATE OF CORRECTION

| | |
|---|---|
| PATENT NO. | : 11,474,435 B2 |
| APPLICATION NO. | : 17/415671 |
| DATED | : October 18, 2022 |
| INVENTOR(S) | : Goorden et al. |

It is certified that error appears in the above-identified patent and that said Letters Patent is hereby corrected as shown below:

On the Title Page

Item (71), "B. V." should be --B.V.--.

In the Specification

Column 11, Line 62, "dz" should be --$d_2$--.

Signed and Sealed this
Third Day of January, 2023

Katherine Kelly Vidal
*Director of the United States Patent and Trademark Office*